United States Patent [19]

Spitzer

[11] Patent Number: 4,667,060
[45] Date of Patent: May 19, 1987

[54] BACK JUNCTION PHOTOVOLTAIC SOLAR CELL

[75] Inventor: Mark B. Spitzer, Lexington, Mass.

[73] Assignee: Spire Corporation, Bedford, Mass.

[21] Appl. No.: 737,711

[22] Filed: May 28, 1985

[51] Int. Cl.$^4$ .............................................. H01L 31/06
[52] U.S. Cl. .................................. 136/255; 136/256; 357/30
[58] Field of Search ................... 136/255, 256; 357/30

[56] References Cited

U.S. PATENT DOCUMENTS

| | | | |
|---|---|---|---|
| 4,106,047 | 8/1978 | Lindmayer | 136/255 |
| 4,131,486 | 12/1978 | Brandhorst, Jr. | 136/255 |
| 4,131,488 | 12/1978 | Lesk et al. | 148/1.5 |
| 4,348,254 | 9/1982 | Lindmayer | 156/647 |
| 4,355,196 | 10/1982 | Chai | 136/259 |

FOREIGN PATENT DOCUMENTS 57-187974 11/1982 Japan .................................. 136/255

OTHER PUBLICATIONS

P. G. Borden et al., "The V-Groove Solar Cell", 16th *IEEE Photovoltaic Specialists Conf.* (1982), pp. 574–577.
C. M. Garner et al., "An Interdigitated Back Contact Solar Cell With High-Current Collection", *IEEE Electron Device Letters*, vol. EDL-1 (1980), pp. 256–258.
R. I. Frank et al., "A Low Series Resistance Silicon Photovoltaic Cell for High Intensity Applications", 14th *IEEE Photovoltaic Specialists Conf.* (1980), pp. 423–430.

Primary Examiner—Aaron Weisstuch
Attorney, Agent, or Firm—Morse, Altman & Dacey

[57] ABSTRACT

A solar cell of novel construction is disclosed featuring the formation of a p-n junction at its rear surface. This allows for a reduction in series resistance and optimization of the p-n junction. The solar cell has a metallic front contact and is lightly doped to reduce contact resistance at the interface between the front contact and the front surface of the cell. The solar cell preferably is formed of either n-type or p-type silicon, with the p-n junction preferably formed therein by ion implantation. Preferably, the solar cell is about 50 micrometers thick and, possesses a conversion efficiency of at least 15% over an input intensity range of from about one to about 1,000 suns. The solar cell is particularly useful for concentrator solar cells intended for operation at high intensity (in excess of 500 suns).

7 Claims, 6 Drawing Figures

BACK JUNCTION PHOTOVOLTAIC SOLAR CELL

BACKGROUND OF THE INVENTION

1. Field of the Invention

The present invention relates generally to solar cells and, more particularly, to a back junction photovoltaic solar cell.

2. The Prior Art

Conventional silicon photovoltaic solar cells, intended for operation over an input intensity range of 80 mW/cm$^2$ to 100 W/cm$^2$ (approximately 1 sun to 1000 suns), have a conversion efficiency in the range of 15 to 20 percent. Such solar cells, whether they are intended for high or low intensity operation, generally comprise a standard p-n junction formed at the front surface of silicon substrate. A metal grid contact is formed upon the front surface to collect photo-generated current and a full-area contact is applied to the rear surface.

The conventional solar cell has several limitations that are a consequence of the cell design. One important limitation arises at high input intensity because large amounts of current must be conducted from the front surface of the device, through a metal grid contact, to wires or leads that connect the device to an external circuit. Power loss owing to series resistance increases as the square of the current, thus increasing as intensity increases. The metal grid cannot be made arbitrarily large without reducing the photo-generated current, since the grid blocks light from entering the cell. Owing to numerous constraints on grid design that are necessary for both minimizing series resistance and maximizing the amount of light that enters the device, other aspects of cell design, such as junction optimization, cannot also be simultaneously optimized.

An unconventional approach to the reduction of series resistance has been termed the etched multi-vertical-junction (EMVJ) cell. The principal feature of the EMVJ cell is the use of deep channels that extend into the bulk of the substrate. Since the p-n junction and metallization are formed over the front surface of the cell and within these channels, the amount of grid metal is increased without an increase in shadow loss, thus reducing series resistance and resulting in a net gain in efficiency, particularly during operation at very high intensity, during which series resistance is the most important loss mechanism. An alternate approach comprises formation of V-groove across the front surface. Grid metallization placed properly within the grooves has negligible shadow loss, because light blocked by the grid is reflected onto a non-obscured region of the front surface. Neither the V-groove design nor the EMVJ design permit optimization or patterning of the p-n junction. Whereas the conventional cells are limited by series resistance, the foregoing alternatives are limited by low open circuit voltage owing to non-optimal junction design.

A third alternative is the interdigitated back contact (IBC) cell design. The IBC design comprises a back p-n junction cell in which both p and n contacts are in the form of interdigitated grids on the rear surface. The p-n junction is patterned on the rear surface and is in this way similar to the invention disclosed here. However, the IBC design does not separate the grid pattern and the junction pattern and thus the two are constrained in the same way that a front junction grating or pocket cell design is constrained. Thus, the IBC design does not decouple grid and junction designs. The invention disclosed herein overcomes both problems by new device design.

SUMMARY OF THE INVENTION

It is a principal object of the present invention to overcome the above disadvantages by providing a solar cell with a p-n junction formed on its back surface.

More specifically, it is an object of the present invention to provide an improved solar cell comprising a thin semiconductor wafer having front and back surfaces, a p-n junction formed at the back surface, a metallic front contact provided on the front surface, with the front surface lightly doped to reduce contact resistance at the interface of the front contact with the wafer, a layer of silicon dioxide provided on the front surface to reduce the recombination velocity, and an antireflective coating at the front surface. Preferably, the p-n junction formed at the back surface is patterned, formed by ion implantation, and comprises a plurality of pocket junctions. Preferably, the back surface is provided with a grating structure formed of a plurality of parallel lines. Preferably, one or both surfaces of the cell are texture etched, and the back surface is provided with a reflector. Preferably, the solar cell is a concentrator silicon solar cell designed for operation at high intensity input levels exceeding 500 suns.

Other objects of the present invention will in part be obvious and will in part appear hereinafter.

The invention accordingly comprises the solar cell of the present disclosure, its components, parts and their interrelationships, the scope of which will be indicated in the appended claims.

BRIEF DESCRIPTION OF THE DRAWINGS

A fuller understanding of the nature and objects of the present invention will become apparent upon consideration of the following detailed description taken in connection with the accompanying drawings, wherein.

DETAILED DESCRIPTION OF THE PREFERRED EMBODIMENTS

Figure 1:
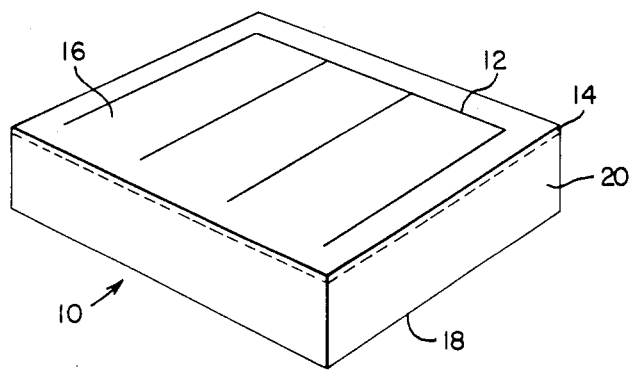
FIG. 1 is a schematic isometric view of a prior art conventional solar cell.

Conventional solar cells comprise silicon wafers having a p-n junction on the front surface, to which electrical contact is made with a patterned metallic grid. A patterned grid, rather than a full-area contact, is used to permit most of the incident sunlight to enter the silicon. As shown in FIG. 1, a conventional solar cell 10 has a front grid 12 in contact with a p-n junction 14 (which is sometimes alternately termed an emitter) formed on the front 16 (the front being the face of the solar cell that receives sunlight). Since the front grid 12 must not contact the back surface 18, patterning of the p-n junction 14 to reduce its area must necessarily be constrained by the pattern used to form the front collection grid 12. A junction design, were it to be patterned to form a grating or pocket structure, would be further constrained by the minority carrier diffusion length, which determines a maximum spacing between junction regions.

The present invention provides a device design that separates the constraints introduced by junction and grid optimization. The invention disclosed herein consists of a new silicon solar cell design wherein the p-n junction is formed on the rear surface of the cell, rather than on the front. The formation of the junction on the rear surface, to which contact is made by full area metallization, decouples the junction design from the front grid pattern design. In this way, the junction and the grid may be independently optimized to achieve both low series resistance and high open circuit voltage.

A solar cell of this type must have high quality surface passivation on the front to preclude surface recombination. The required passivation may be achieved by the combination of a built-in front surface field, formed for example by ion implantation, or diffusion, and a grown silicon dioxide layer. Such a combination can reduce the surface recombination velocity to about 100 cm/sec.

The conversion efficiency of the back junction solar cell is highly dependent upon the silicon used for its fabrication. The ratio of minority carrier diffusion length to cell thickness determines the collection efficiency of the back p-n junction. When this dimensionless ratio is larger than three, most carriers photogenerated at the front of the cell are able to diffuse to the back p-n junction where all photo-generated carriers are collected. Typical but non-limiting values for cells made from 0.3 ohm-cm silicon are: diffusion length of 200 micrometers and cell thickness of 50 micrometers.

The most important attribute of this invention is the absence of grid-related constraints on junction design: the junction may be patterned to form either a grating structure or a pocket structure, or any other configuration. Grating and pocket-type junction patterns are useful for the attainment of high open circuit voltage, since such designs permit reduction of junction area. As noted, in this invention the junction pattern is entirely independent of the front grid pattern.

More often than not, the conventional solar cell 10 is provided with a full surface back contact on its back surface 18. As is readily apparent from FIG. 1, the p-n junction 14 must carry photogenerated carriers to the grid 12. Thus, series resistance of the p-n junction 14 must be minimized, particularly in solar cells intended for high intensity operation. This constraint typically requires heavy doping and a deep junction. Unfortunately, heavy doping limits the open circuit voltage by increasing the device saturation current, and the use of a deep junction reduces the quantum efficiency of the solar cell in the wavelength range of 300 to 600 nm.

Figure 2:
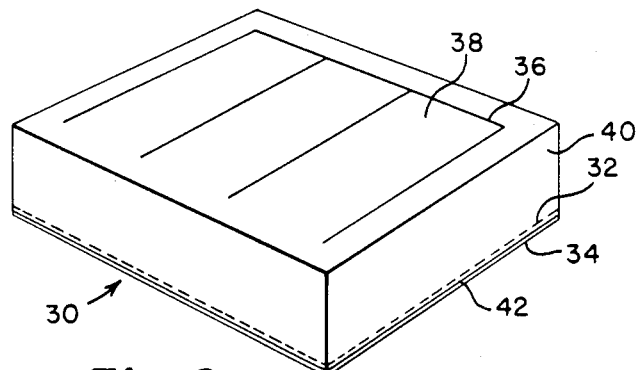
FIG. 2 is a view similar to FIG. 1 but showing a solar cell constructed in accordance with the present invention.

A solar cell 30 constructed in accordance with the invention is illustrated in FIG. 2. In the construction of the solar cell 30, a p-n junction 32 is formed at the back surface 34 of the cell, with a grid 36 provided at the front surface 38. Preferably, one or both of the surfaces 34 and 38 are texture etched so as to increase the photon pathlength by refraction. Preferably, the solar cell 30 is formed of a thin semiconductor wafer 40, which may be formed of an n-type or a p-type silicon.

The use of thin cells 30 (for example, about 50 micrometers thick) reduces the series resistance of the device as well as improves the current collection, since the distance that both majority and minority carries must travel is reduced. Such cells may not absorb all of the available incident photons, particularly if the cells are very thin; thus it is advantageous to utilize a back surface reflector 42 to double the optical pathlength. With the surfaces 34 and/or 38 texture etched, the optical pathlength may be made long, while the distance to the p-n junction 32 that carriers must traverse may be made short.

Thus, the p-n Junction 32 is completely independent of the front grid 36. Such a design has the following advantages. First, in contrast to the conventional design of cell 10, current is not made to flow through a thin p-n junction 14 at the cell front 16; the invention thus reduces series resistance. Second, the p-n junction 32 may be of arbitrary depth or doping, since absorption at the back 34 of the cell 30 is usually not consequential, thus yielding reduction of junction series resistance. Third, the p-n junction 32 may be patterned to form a pocket or a grating structure as hereafter described with reference to FIGS. 3 and 4, thus reducing p-n saturation current and raising the open circuit voltage of the cell 30.

Figure 3:
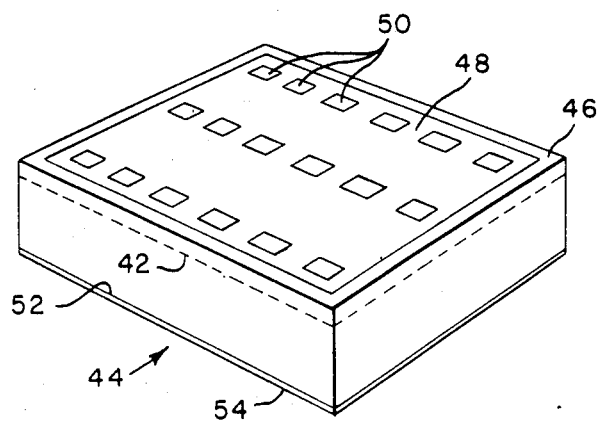
FIG. 3 is a schematic isometric view of a solar cell illustrating a pocket configuration applied to its back surface to form a back junction thereon.

FIG. 3 shows a non-limiting example of a solar cell 44 provided with a patterned back junction 50 located in a plane 42. In this example, the patterned p-n junction 50 is formed by ion implantation on the back surface 46, which is coated with a silicon dioxide film 48. The film 48, which is patterned, acts as an ion implantation mask, allowing only a plurality of exposed portions of the back surface 46 to receive the ion implantation, forming the patterned p-n junction 50. The oxide film 48 also functions as a separator between the non-implanted back surface 46 and a metal contact, not shown, that is applied later. In the example, the p-n junction pocket array pattern 50 represented by the plurality of exposed portions comprises 10 micrometers × 10 micrometers squares on 50 micrometers centers, yielding a factor of 25 reduction of junction area. A metal contact grid 54 is applied to the front surface 52.

Figure 4:
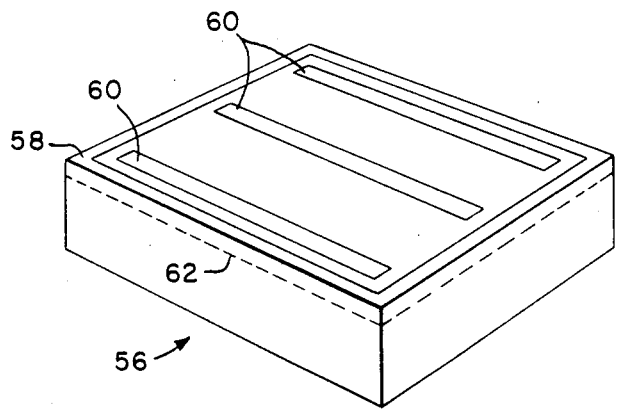
FIG. 4 is a view similar to FIG. 3 but showing an alternate configuration for a back junction.

FIG. 4 shows a non-limiting example of a solar cell 56 provided with a patterned back p-n junction in the shape of a grating structure 60 and located in a plane 62 near the back surface 58. The grating structure 60 comprises a plurality of 2 to 5 micrometers wide lines on 500 micrometers centers, yielding a factor of 100 reduction of junction area. The critical parameter in the design of the junction spacing is the minority carrier diffusion length. The spacing must be much less than one diffusion length in order to achieve high collection efficiency of photons generated in regions far from the p-n junction 62.

Figure 5:
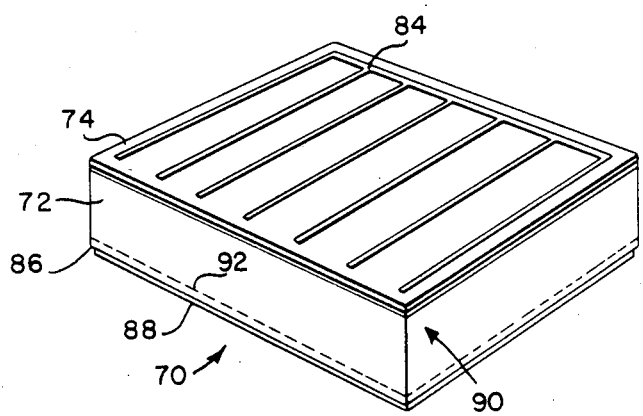
FIG. 5 is a schematic isometric view of a further embodiment of a solar cell of the invention.
Figure 6:
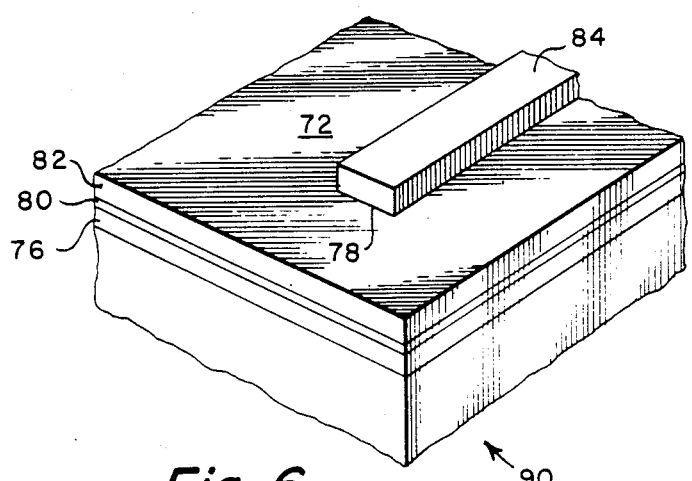
FIG. 6 is an enlarged corner portion of the cell shown in FIG. 5.

FIGS. 5 and 6 (FIG. 6 being an enlarged corner portion of the device shown within a circle 90 in FIG. 5) illustrate a non-limiting example of a preferred embodiment of a back junction photovoltaic solar cell 70, which preferably is a concentrator silicon solar cell constructed in accordance with the invention. The solar cell 70 preferably is formed from a 0.30 ohm-cm phosphorus doped silicon wafer 72. The front surface 74 is lightly doped with phosphorus, as at 76 just below the surface, to reduce contact resistance at the silicon/metal interface 78. The front surface 74 is further treated after the phosphorus doping to provide it with a silicon dioxide layer 80, upon which an antireflection coating 82 is applied. The silicon dioxide layer 80 reduces the recombination velocity. The front contact 84 comprises successive evaporated layers of Ti and Pd upon which Ag is electroplated. The back surface 86 of the device 70 illustrated in FIG. 5 includes a plurality of ion implanted pocket junctions 92, as described previously in FIG. 3. Back surface metallization 88 comprises successive evaporations of Al, Ti, Pd, and Ag. The Al acts as a back surface reflector. The overall thickness of the device 70 is about 50 micrometers.

Thus it has been shown and described preferred embodiments of improved solar cells 30 and 70, which solar cells 30 and 70 satisfy the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sence.

What is claimed is:

1. A solar cell comprising:
   (a) a semiconductor wafer having a front surface and a back surface; and
   (b) a p-n junction provided at said back surface thereof;
   (c) said front surface provided with a metallic front contact and being lightly doped to reduce contact resistance at the interface between said metallic front contact and said semiconductor wafer;
   (d) said p-n junction at said back surface being patterned;
   (e) said solar cell having a conversion efficiency of at least 15% over an input intensity range from about one sun to about 1,000 suns.

2. The solar cell of claim 1 wherein said front surface is further provided with a layer of silicon dioxide to reduce the recombination velocity thereat.

3. The solar cell of claim 2 wherein said front surface is further provided with an antireflective coating and wherein said metallic front contact is formed of successively evaporated layers of titanium and palladium, with a layer of silver being electroplated thereon.

4. The solar cell of claim 1 wherein said light doping at said front surface is effected by phosphorus.

5. The solar cell of claim 1 wherein said p-n junction at said back surface is formed by ion implantation, wherein said ion implanted p-n junction comprises a plurality of ion-implanted pocket junctions, and wherein said ion implanted pocket junctions are formed by a pocket array pattern comprising a plurality of squares, each about ten micrometers square formed on 50 micrometers centers, achieving a reduction in junction area by a factor of 25.

6. The solar cell of claim 1 wherein said back surface is provided with a patterned back p-n junction in the shape of a grating structure comprising a plurality of lines, each from about two micrometers to about five micrometers wide and centered on 500 micrometers, achieving a reduction in junction area by a factor of 100.

7. The solar cell of claim 1 which is a concentrator silicon solar cell designed for operation at high intensity input levels exceeding 500 suns.

* * * * *

UNITED STATES PATENT AND TRADEMARK OFFICE
CERTIFICATE OF CORRECTION

PATENT NO. : 4,667,060
DATED : May 19, 1987
INVENTOR(S) : Mark B. Spitzer

It is certified that error appears in the above-identified patent and that said Letters Patent is hereby corrected as shown below:

In column 1, line 3, before

"Background of the Invention" insert

--The United States Government has rights in this invention pursuant to Contract No. DE-AC04-76DP00789 (Subcontract No. 58-1430) between the United States Department of Energy and Spire Corporation. --

Signed and Sealed this

Thirteenth Day of March, 1990

Attest:

JEFFREY M. SAMUELS

Attesting Officer

Acting Commissioner of Patents and Trademarks